United States Patent
Murayama et al.

(10) Patent No.: US 7,176,099 B2
(45) Date of Patent: Feb. 13, 2007

(54) HETERO-JUNCTION BIPOLAR TRANSISTOR AND MANUFACTURING METHOD THEREOF

(75) Inventors: Keiichi Murayama, Okayama (JP); Akiyoshi Tamura, Suita (JP); Masanobu Nogome, Bizen (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 72 days.

(21) Appl. No.: 11/100,511

(22) Filed: Apr. 7, 2005

(65) Prior Publication Data

US 2005/0199910 A1    Sep. 15, 2005

Related U.S. Application Data

(62) Division of application No. 10/748,158, filed on Dec. 31, 2003, now Pat. No. 6,903,388.

(30) Foreign Application Priority Data

Jun. 30, 2003  (JP)  ............................. 2003-186827
Oct. 7, 2003   (JP)  ............................. 2003-348750

(51) Int. Cl.
*H01L 21/8222* (2006.01)

(52) U.S. Cl. ...................... 438/312; 438/338; 438/342; 257/E51.04

(58) Field of Classification Search ......... 438/312–342
See application file for complete search history.

(56) References Cited

U.S. PATENT DOCUMENTS

| | | | |
|---|---|---|---|
| 4,958,208 A | 9/1990 | Tanaka | |
| 5,903,018 A | 5/1999 | Shimawaki | |
| 5,952,672 A | 9/1999 | Kikkawa | |
| 6,525,349 B2 | 2/2003 | Hartmann | |
| 6,800,880 B1 | 10/2004 | Tsai | |
| 6,809,400 B2 | 10/2004 | Harmon et al. | |
| 6,878,976 B2* | 4/2005 | Coolbaugh et al. | 257/183 |
| 6,881,988 B2 | 4/2005 | Niwa et al. | |
| 2002/0121675 A1 | 9/2002 | Azuma et al. | |
| 2003/0047753 A1 | 3/2003 | Fujita et al. | |
| 2003/0136956 A1 | 7/2003 | Niwa et al. | |

FOREIGN PATENT DOCUMENTS

JP    02-191338    7/1990

(Continued)

*Primary Examiner*—H. Jey Tsai
(74) *Attorney, Agent, or Firm*—Wenderoth, Lind & Ponack, L.L.P.

(57) ABSTRACT

A hetero-junction bipolar transistor that satisfies high resistance required to avoid a potential breakdown includes: an n-type sub-collector layer 110 that is made of GaAs; an n-type first collector 121 that is made of a semiconductor material with a smaller avalanche coefficient than that of the sub-collector 110 and is formed on the sub-collector layer 110; a second collector layer 132 that is made of n-type or i-type GaAs with lower dopant concentration than that of the sub-collector layer 110 and is formed on the first collector layer 121; a p-type base layer 133 that is made of GaAs and is formed on the second collector layer 132; and emitter layer 134 that is made of a semiconductor material with a larger band gap than that of the base layer 133 and is formed on the base layer 133.

4 Claims, 6 Drawing Sheets

FOREIGN PATENT DOCUMENTS

| | | |
|---|---|---|
| JP | 07-161727 | 6/1995 |
| JP | 07-193084 | 7/1995 |
| JP | 09-246281 | 9/1997 |
| JP | 11-243058 | 9/1999 |
| JP | 2000-260782 | 9/2000 |
| JP | 2000-260783 | 9/2000 |
| JP | 2003-163218 | 6/2003 |
| JP | 2003-218123 | 7/2003 |

* cited by examiner

Distance from surface of emitter layer($\mu$m)

HETERO-JUNCTION BIPOLAR TRANSISTOR AND MANUFACTURING METHOD THEREOF

This is a Divisional Application of U.S. patent application Ser. No. 10/748,158, filed Dec. 31, 2003 now U.S. Pat. No. 6,903,388.

BACKGROUND OF THE INVENTION (1) Field of the Invention

The present invention relates to a hetero-junction bipolar transistor and its manufacturing method.

(2) Description of the Related Art

A hetero-junction bipolar transistor (hereinafter referred to as HBT) using a semiconductor of a large band gap as an emitter has been commercially utilized for a high-frequency analogue element of a cell phone and the like. Especially, an InGaP/GaAs HBT using InGaP as an emitter has low dependency to temperature. Therefore, it is expected that the InGaP/GaAs HBT as a device with high reliability will be used in increasingly wider application areas.

Hereinafter, using figures, the device structure and its manufacturing method of a general InGaP/GaAs HBT is explained. (For example, refer to Japanese Laid-Open Patent Application No. 2000-260783).

FIG. 1 is a cross-sectional diagram showing an npn-type InGaP/GaAs HBT.

As is shown in FIG. 1, the InGaP/GaAs HBT is composed of: a semi-insulating GaAs semiconductor substrate 400; an $n^+$-type GaAs sub-collector layer 410 formed on the semiconductor substrate 400 by doping an n-type dopant with high concentration; a first step layer 420 formed to be a salient on a predetermined region of the sub-collector layer 410; a second step layer 430 formed to be the second salient on a predetermined region of the first step layer 420; an emitter electrode 440 formed on the second step layer 430, for example, made of Ti/Pt/Au; base electrodes 450, made of a multi-layer metal and the like including Pt, formed in exposed areas on the first step layer 420 on the periphery of the second step layer 430 by defusing thermally so as to come in contact with a base layer 422; collector electrodes 460, made of AuGe/Ni/Au and the like formed on exposed areas on the sub-collector layer 410; and element isolation regions 470 formed in regions on the periphery of elements so as to reach the semiconductor substrate 400 through the sub-collector layer 410 by ion implantation and inactive heat-treating, for isolating a unit HBT electrically.

Here, the first step layer 420 is laminated with a non-doped or n-type GaAs collector layer 421 of low dopant concentration, a p-type GaAs base layer 422 of high dopant concentration, and an n-type InGaP emitter layer 423 in sequence.

Additionally, the second step layer 430 is laminated with n-type GaAs emitter cap layer 431 and an n-type InGaAs emitter contact layer 432 of low contact resistance in sequence.

By the way, applicability of an InGaP/GaAs-system HBT has been widened in recent years and high output and high resistance to breakdown are required for the HBT. For example, as for a transmitting amplifier of a cell phone specifically, when the HBT is commercially utilized as a power device of a terminal transmitter of the GSM-system, not the conventional CDMA-system, it is required that the HBT is not broken at the high output of 3 to 4 W. In other words, it is required that the HBT is not broken at VSWR (Voltage Standing Ratio)=10:1.

However, there is a problem that a conventional InGaP/GaAs-system HBT cannot satisfy high resistance required to avoid a potential breakdown of the HBT with high output.

Here, using FIGS. 2 and 3, the breakdown of the HBT with the high output is explained.

FIG. 2 is a diagram showing collector voltage $V_C$-collector current $I_C$ characteristic and breakdown voltage curve of the InGaP/GaAs-system HBT. By the way, the $V_C$-$I_C$ characteristic is different at each base current $I_B$, and the breakdown voltage curve is drawn by plotting the points when the HBT is broken at each base current $I_B$.

It is thinkable from FIG. 2 that the breakdown of the HBT can be divided into breakdowns at a high current region A and a low current region B, and the breakdown of the HBT with high output is caused by overlapping of load curves in a breakdown region at collector voltage of about 6V in the high current region A.

FIG. 3A–FIG. 3C show the results of the electric field simulations done by the inventor. In FIG. 3A–FIG. 3C, a horizontal axis shows a distance from the surface of the emitter layer to the sub-collector layer; the vertical axis shows an electric field density at each current value. More specifically, FIG. 3A shows the electric field density in the low current region B (for example, $I_B=1$ µA, $V_C=3.5V$). FIG. 3B shows the electric field density between the high current region A and the low current region B (for example, $I_B=10$ µA, $V_C=3.5V$). FIG. 3C shows the electric field density in the high current region A (for example, $I_B=34$ µA, $V_C=3.5V$).

It is apparent from FIG. 3 that the largest electric field density is applied to the base-collector interface in the low current region B and the avalanche breakdown which causes the breakdown is produced at the base-collector interface (FIG. 3A). When the current increases and electrons of higher density than the collector density is injected (Kirk effect), the region to which the largest electric field is applied shifts from the base side to the sub-collector side (FIG. 3B). When the current further increases, the largest electric field is applied to the collector-sub-collector interface (FIG. 3C) and an avalanche breakdown is produced at the collector-sub-collector interface. This phenomenon is described in detail on Page 147 of the reference book 2nd edition of "Semiconductor Devices" written by A. Sze.

The above explanation shows that the production of avalanche breakdown at the collector-sub-collector interface causes the breakdown of the HBT with high output.

SUMMARY OF THE INVENTION

In view of the foregoing problem, it is the object of the present invention to provide a hetero-junction bipolar transistor that satisfies high resistance required to avoid a potential breakdown of the HBT with high output.

In order to achieve the object, the hetero-junction bipolar transistor according to the present invention comprises: an n-type sub-collector layer that is made of GaAs; an n-type first collector layer that is made of a semiconductor material with a smaller avalanche coefficient than an avalanche coefficient of the sub-collector layer and that is formed on the sub-collector layer; a second collector layer that is made of one of n-type and i-type GaAs with lower dopant concentration than dopant concentration of the sub-collector layer and that is formed on the first collector layer; a p-type base layer that is made of GaAs and that is formed on the second collector layer; and an n-type emitter layer that is made of a semiconductor material with a larger band gap than a band gap of the base layer and that is formed on the base layer. Here, the first collector layer may be made of $In_xGa_{1-x}P$ ($0.47 \leq x \leq 0.52$), the first collector layer may have a disordered structure, and the emitter layer may be made of $In_xGa_{1-x}P$ ($0.47 \leq x \leq 0.52$). Additionally, the first collector layer may be made of $Al_yGa_{1-y}As$ ($0 \leq y \leq 1$), a composition ratio y of Al in the first collector layer may gradually change in direction from the interface between the first collector layer and the sub-collector layer to the interface between the first collector layer and the second collector layer, and the emitter layer may be made of $Al_yGa_{1-y}As$ ($0 \leq y \leq 1$).

Accordingly, since a semiconductor layer, made of a semiconductor material with a small avalanche coefficient, is inserted into the collector-sub-collector interface to which the electric field is concentrated when the electric current is high, an avalanche breakdown at the collector-sub-collector interface is restrained, and thus it is possible to realize the HBT that satisfies high resistance required to avoid a potential breakdown of the HBT with high output.

Here, a dopant concentration of the first collector layer may be $1 \times 10^{17}$ cm$^{-3}$ or more. And a thickness of the first collector layer may be under 200 nm.

Accordingly, since the collector resistance is decreased and on resistance is restrained, it is possible to realize a highly efficient HBT.

Additionally, a dopant may have a concentration characteristic where the concentration becomes lower in direction from an interface between the first collector layer and the sub-collector layer to an interface between the first collector layer and the second collector layer.

Accordingly, since the discontinuity of the conduction band that exist between the first collector layer and the sub-collector layer and the first collector layer and the second collector layer is alleviated, and the on resistance is restrained, it is possible to realize a highly efficient HBT.

Moreover, the above-mentioned hetero-junction bipolar transistor may further comprise a semiconductor layer that is formed between the first collector layer and the second collector layer, wherein the semiconductor layer reduces discontinuity of a conduction band between the first collector layer and the second collector layer. Additionally, the semiconductor layer may be an n-type spacer layer that is made of the same semiconductor material as the first collector layer or the second collector layer, and the semiconductor layer has a dopant concentration of $1 \times 10^{18}$ cm$^{-3}$ or less. Or, the semiconductor layer may include: an n-type first spacer layer that is made of the same semiconductor material as the first collector layer, has a dopant concentration of $1 \times 10^{18}$ cm$^{-3}$ or less and is in contact with the first collector layer; and an n-type second spacer layer that is made of the same semiconductor material as the second collector layer, has a dopant concentration of $1 \times 10^{18}$ cm$^{-3}$ or less and is in contact with the second collector layer.

Accordingly, since the discontinuity of the conduction band that exists between the first collector layer and the second collector layer is alleviated, and the on resistance is restrained, it is possible to realize a highly efficient HBT.

Furthermore, the present invention can be realized as a manufacturing method of a hetero-junction bipolar transistor, comprising: a first step of laminating a sub-collector layer, a first collector layer, a first spacer layer, a second spacer layer, a second collector layer, a base layer and an emitter layer on a semiconductor substrate in this sequence; a second step of etching a predetermined region in the emitter layer with a first etchant; a third step of etching the base layer, the second collector layer and the second spacer layer with a second etchant using the etched emitter layer as a mask; and a fourth step of etching, with a third etchant, predetermined regions in the first spacer layer and the first collector layer exposed by the etching with the second etchant. Here, each of the above-mentioned sub-collector layer, the base layer, the second collector layer and the second spacer layer may be made of GaAs to which a dopant is doped, and each of the first collector layer and the first spacer layer may be made of InGaP to which a dopant is doped, the second etchant in the third step may be a mixed solution of phosphoric acid, hydrogen peroxide and water, and the third etchant in the fourth step may be hydrochloric acid diluted with water. Or, the hetero-junction bipolar transistor may further include an emitter cap layer, an emitter contact layer, an emitter electrode, a collector electrode and a base electrode, the first step may include: a first sub-step of laminating the emitter cap layer and the emitter contact layer on the emitter layer in this sequence; and a second sub-step of etching predetermined regions in the emitter cap layer and the emitter contact layer with a fourth etchant, and the manufacturing method of the hetero-junction bipolar transistor may further comprise: a fifth step of forming the collector electrode on the sub-collector layer exposed by the etching with the third etchant; and a sixth step of forming the emitter electrode on the emitter layer exposed by the etching with the fourth etchant, and forming the base electrode on the emitter contact layer exposed by the etching with the fourth etchant. Or, the above-mentioned hetero-junction bipolar transistor may have a stepped surface, a third step layer that constitutes the stepped surface may be formed by etching the predetermined regions in the emitter cap layer and the emitter contact layer in the second sub-step, a second step layer that constitutes the stepped surface may be formed by etching the emitter layer that exists outside an outer edge of the third step layer in the second step and by etching the base layer, the second collector layer and the second spacer layer using said etched emitter layer as the mask in the third step, and a first step layer that constitutes the stepped surface may be formed by etching the first spacer layer and the first collector layer that exist outside an outer edge of the second step layer in the fourth step.

Accordingly, since each of the first spacer layer and the sub-collector layer functions as a stopper layer for etching with the etchant, it is possible to realize a manufacturing method of a hetero-junction bipolar transistor to improve substantially the accuracy of etching.

As is apparent from the above explanation, the hetero-junction bipolar transistor according to the present invention can restrain the avalanche breakdown at the collector-sub-collector interface. Therefore, it has the effect to realize a hetero-junction bipolar transistor that can satisfy high resistance required to avoid a potential breakdown of the hetero-junction bipolar transistor with high output. Additionally, the hetero-junction bipolar transistor according to the present invention can restrain the on resistance. Therefore, it has the effect to realize a highly efficient HBT.

Consequently, the present invention makes it possible to provide a highly efficient HBT that can satisfy high resistance required to avoid a potential breakdown of the HBT with high output. As a result, it is possible to realize an HBT that can be commercially utilized as a power device of a terminal transmitter of the GSM system. And therefore, its practical value is extremely high.

As further information about technical background to this application, Japanese Patent Application No. 2003-186827 filed on Jun. 30, 2003 is incorporated herein by reference.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

The hetero-junction bipolar transistor (HBT) according to the embodiment of the present invention will be explained below with reference to the figures.

Figure 1:
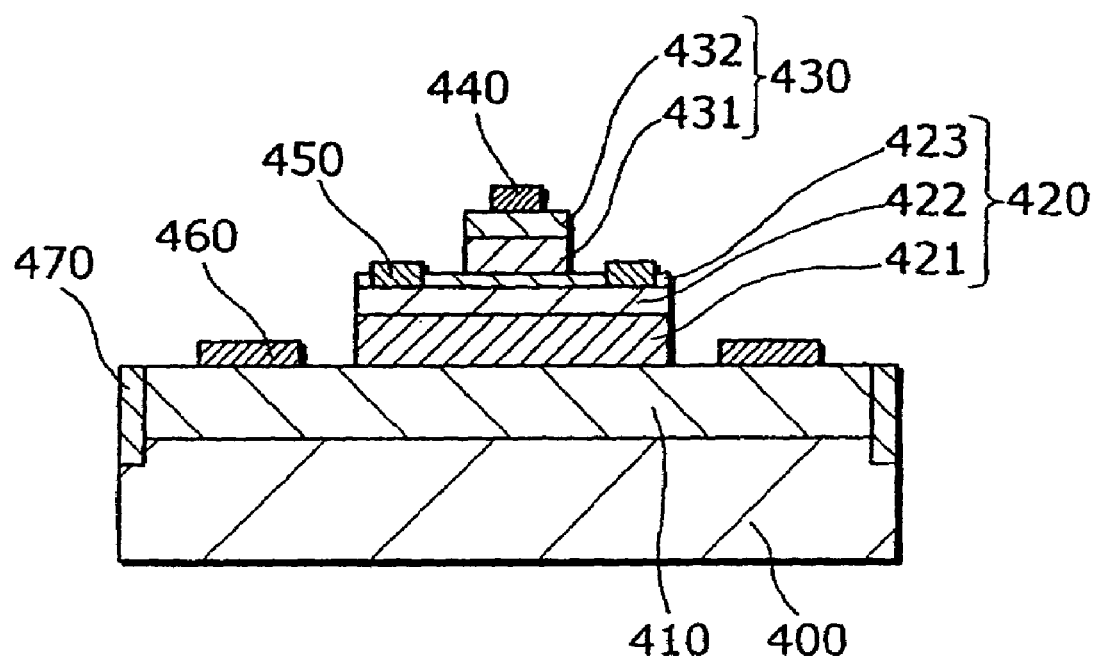
FIG. 1 is a cross-sectional diagram showing a conventional HBT.
Figure 2:
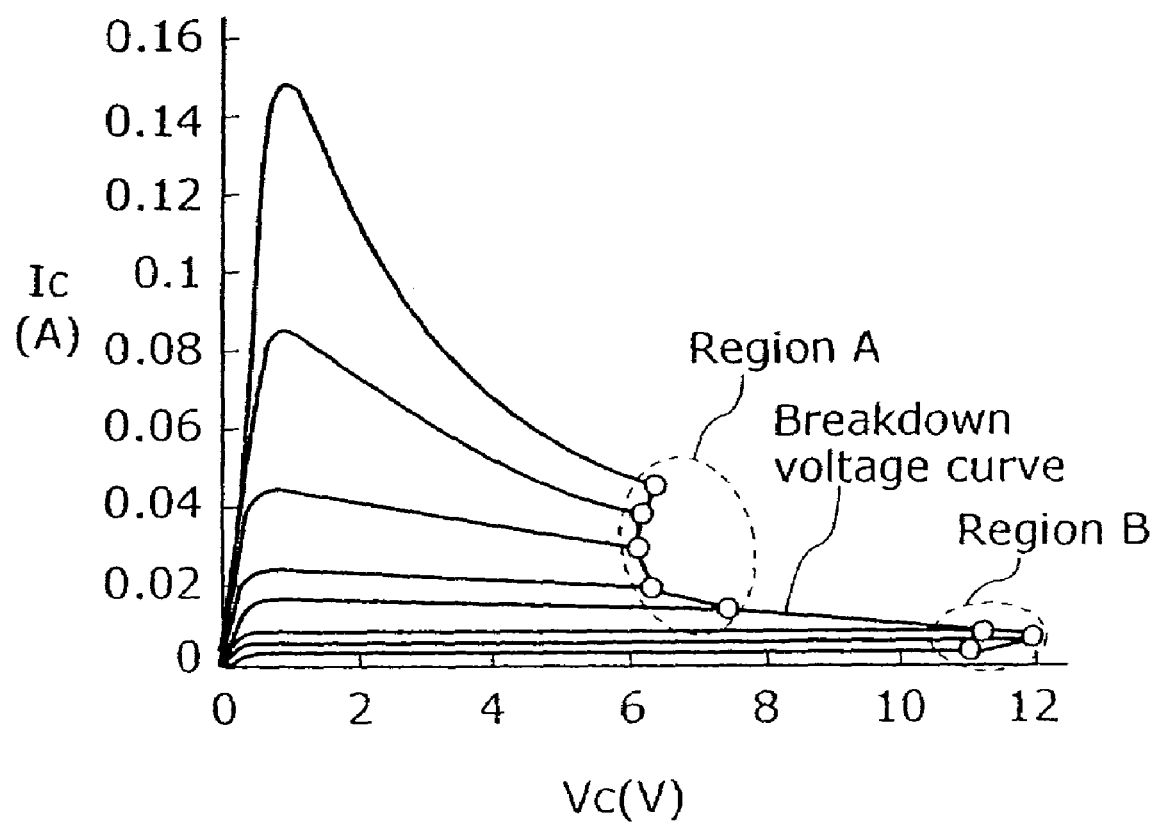
FIG. 2 is a diagram showing a $V_C$-$I_C$ characteristic and breakdown voltage curves for explaining a breakdown of the HBT with high output.
Figure 3A:
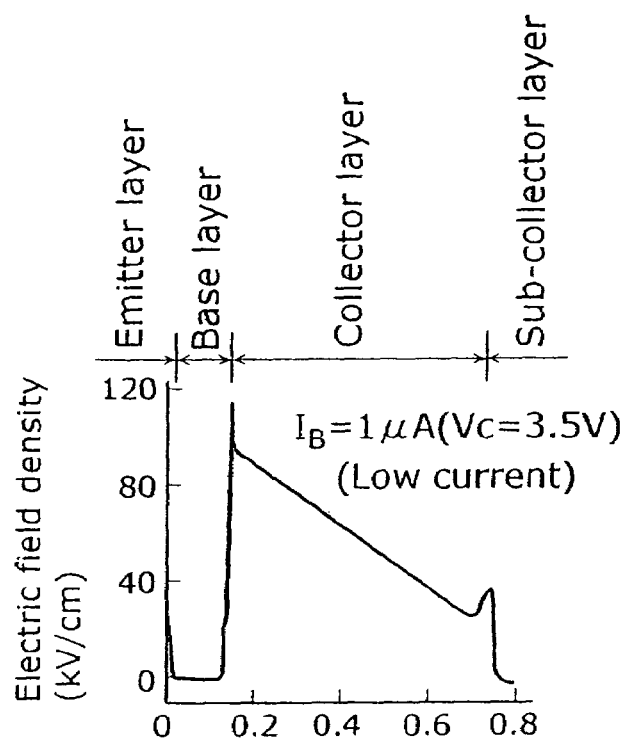
FIG. 3A–FIG. 3C are diagrams showing results of electric field simulations for explaining breakdowns of the HBT with high output.
Figure 3B:
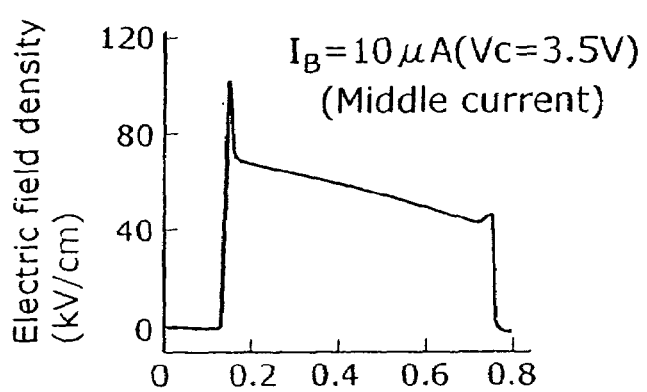
Figure 3C:
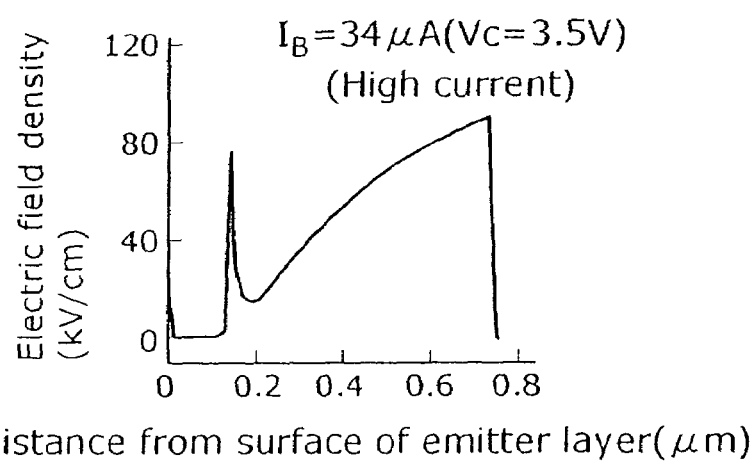
Figure 4:
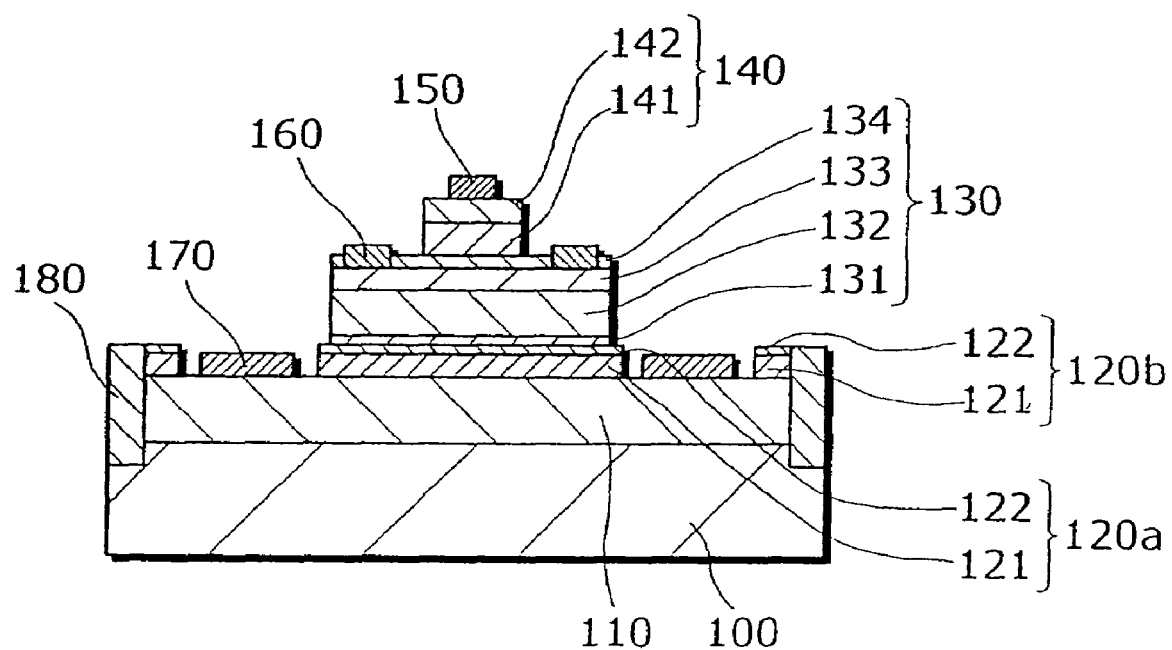
FIG. 4 is a cross-sectional diagram showing a structure of an HBT according to the embodiment of the present invention.

FIG. 4 is a cross-sectional diagram showing a structure of an HBT according to the present embodiment.

The HBT according to the present embodiment aims to realize an HBT that satisfies high resistance required to avoid a potential breakdown of the HBT with high output. The HBT is composed of: a semi-insulating GaAs semiconductor substrate 100; an n$^+$-type GaAs sub-collector layer 110 formed on the semiconductor substrate 100 by doping an n-type dopant with high dopant concentration of $5\times10^{18}$ cm$^{-3}$; a first step layer 120a and 120b formed to be a salient on a predetermined region of the sub-collector layer 110; a second step layer 130 formed to be the second salient on a predetermined region of the first step layer 120a; a third step layer 140 formed to be the third salient on a predetermined region of the second step layer 130; an emitter electrode 150, made of Pt/Ti/Pt/Au, formed on the third step layer 140; base electrodes 160, made of Pt/Ti/Pt/Au, formed in exposed areas on the second step layer 130 on the periphery of the third step layer 140 by applying heat treatment so as to have ohmic contact with a base layer 132; collector electrodes 170, made of AuGe/Ni/Au, formed on exposed areas on the sub-collector layer 110 on the periphery of the first step layer 120a; and element isolation regions 180 formed in regions on the periphery of elements so as to reach the semiconductor substrate 100 through the first step layer 120b, for isolating a unit HBT electrically.

Here, the first step layer 120a and 120b is laminated with an In$_x$Ga$_{1-x}$P first collector layer 121 and an In$_x$Ga$_{1-x}$P first spacer layer 122 in sequence. The first collector layer 121, with a thickness of less than 200 nm, for example, 100 nm, is made of In$_x$Ga$_{1-x}$P ($0.47 \leq x \leq 0.52$) that is a semiconductor material with a smaller avalanche coefficient than GaAs of the sub-collector layer 110, and formed by doping an n-type dopant with a dopant concentration of $1\times10^{17}$ cm$^{-3}$ or more, for example, $1\times10^{17}$ cm$^{-3}$. The first spacer layer 122, with a thickness of 10 nm, is made of In$_x$Ga$_{1-x}$P ($0.47 \leq x \leq 0.52$) that is the same semiconductor material with the first collector layer 121, and formed by doping an n-type dopant with a dopant concentration of $1\times10^{18}$ cm$^{-3}$ or less, for example, $1\times10^{18}$ cm$^{-3}$, for alleviating discontinuity of a conduction band between the first collector layer 121 and a second collector layer 132.

Since the dopant concentration of the first collector layer 121 is $1\times10^{17}$ cm$^{-3}$ or more, it is possible to decrease collector resistance. In other words, as the Table 1 below indicating the dopant concentration dependency of the first collector layer 121 shows, it is possible to satisfy high efficiency and at the same time to satisfy the required characteristics (efficiency of 45% or more and VSWR=10:1 or more).

TABLE 1

| Dopant concentration of InGaP | unit cm-3 | Undoped | 1.00E+17 |
|---|---|---|---|
| Electrical strength | V | 21.7 | 20.7 |
| Ron | Ω | 10 | 9 |
| DC breakdown voltage (Ic = 20 mA) | V | 12.5 | 12.5 |
| VSWR |  | 10:1 | 10:1 |
| Efficiency | % | 48 | 50 |

Additionally, the thickness of the first collector layer 121 is decided considering formation of a protective film for the final element and stepped cuts for forming electric wiring and is less than 200 nm. Therefore, it is possible to decrease collector resistance. In other words, as the Table 2 below indicating the thickness dependency of the first collector layer 121 shows, it is possible to decrease collector resistance and at the same time to satisfy the required characteristics (efficiency of 45% or more and VSWR=10:1 or more).

TABLE 2

| Thickness of InGaP | unit Å | 0 | 500 | 1000 | 1500 | 2000 | 2500 |
|---|---|---|---|---|---|---|---|
| Electrical strength | V | 19 | 20 | 21.7 | 23.1 | 25 | 27 |
| Ron | Ω | 7 | 9 | 10 | 12 | 15 | 20 |
| DC breakdown voltage (Ic = 20 mA) | V | 8 | 9 | 12.5 | 14.5 | 16 | 18 |
| VSWR |  | 5:1 | 8:1 | 10:1 | 12:1 | 14:01 | 15:01 |
| Efficiency | % | 50 | 49 | 48 | 47 | 44 | 41 |

Additionally, since the dopant concentration of the first spacer layer 122 is $1\times10^{18}$ cm$^{-3}$ or less, it is possible to restrain concentration of electric field in the spacer layer in which breakdown of the HBT starts. In other words, as the Table 3 below indicating the dopant concentration dependency of the first spacer layer 122 shows, it is possible to avoid extreme lowering of breakdown starting with the dopant concentration of $2\times10^{18}$ cm$^{-3}$ as a threshold and at the same time to satisfy the required characteristics (efficiency of 45% or more and VSWR=10:1 or more).

TABLE 3

| Dopant concentration of n$^+$ layer | unit cm-3 | 4.00E+18 | 2.00E+18 | 1.00E+18 | 5.00E+17 |
|---|---|---|---|---|---|
| Thickness of n$^+$ layer | Å | 25 | 50 | 100 | 200 |
| Electrical strength | V | 20 | 21.7 | 22 | 22.5 |

TABLE 3-continued

| Dopant concentration of n+ layer | unit | 4.00E+18 | 2.00E+18 | 1.00E+18 | 5.00E+17 |
|---|---|---|---|---|---|
| Ron | Ω | 9.5 | 9.5 | 9.5 | 9.5 |
| DC breakdown voltage (Ic = 20 mA) | V | 10 | 12.5 | 13 | 13.5 |
| VSWR | | 8:01 | 10:1 | 10:1 | 12:1 |
| Efficiency | % | 48 | 48 | 48 | 48 |

Additionally, the second step layer 130 is laminated with a GaAs second spacer layer 131, a GaAs second collector layer 132, a GaAs base layer 133 and an $In_xGa_{1-x}P$ emitter layer 134 in sequence. The second spacer layer 131, with a thickness of 10 nm, is made of GaAs that is the same semiconductor material with the second collector layer 132 and formed by doping an n-type dopant with the dopant concentration of $1\times10^{18}$ cm$^{-3}$ or less, for example, $1\times10^{18}$ cm$^{-3}$, for alleviating the discontinuity of a conduction band between the first collector layer 121 and the second collector layer 132, the second collector layer 132, with a thickness of 500 nm, is formed by doping a n-type dopant with the dopant concentration of $1\times10^{16}$ cm$^{-3}$, the base layer 133, with a thickness of 100 nm, is formed by doping a p-type dopant with the dopant concentration of $4\times10^{19}$ cm$^{-3}$, and the emitter layer 134, with a thickness of 50 nm, is made of $In_xGa_{1-x}P$ ($0.47 \leq x \leq 0.52$) that is a semiconductor material of larger band gap than that of GaAs of the base layer 133 and formed by doping a n-type dopant with the dopant concentration of $1\times10^{18}$ cm$^{-3}$. Since the dopant concentration of the second spacer layer 131 is $1\times10^{18}$ cm$^{-3}$ or less, it is possible to restrain concentration of electric field in the spacer layer in which breakdown of the HBT starts.

The third step layer 140 is laminated with a GaAs emitter cap layer 141 and an InGaAs emitter contact layer 142 in sequence. The emitter cap layer 141, with a thickness of 200 nm, is formed by doping an n-type dopant with the dopant concentration of $3\times10^{18}$ cm$^{-3}$, and the emitter contact layer 142, with the thickness of 100 nm, is formed by doping an n-type dopant with the dopant concentration of $1\times10^{19}$ cm$^{-3}$.

Next, a manufacturing method of the HBT with the structure described above is explained with reference to the cross-sectional diagrams, FIGS. 5A–5C and FIGS. 6A–6C. It should be noted that the same reference numbers are assigned to the same elements in FIG. 4 and their detailed explanations are omitted here.

Figure 5A:
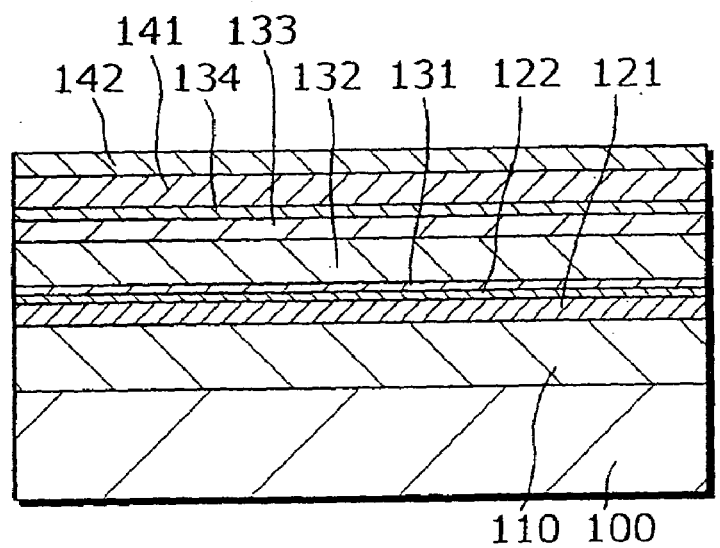
FIG. 5A–FIG. 5C are cross-sectional diagrams showing a manufacturing method of the HBT according to the present embodiment.

First, as is shown in FIG. 5A, by crystal growth methods like a molecular beam epitaxial method (MBE method) or a metal organic chemical vapor deposition method (MOCVD method), the following layers are laminated on the semiconductor substrate 100; the sub-collector layer 110, the first collector layer 121, the first spacer layer 122, the second spacer layer 131, the second collector layer 132, the base layer 133, the emitter layer 134, the emitter cap layer 141 and the emitter contact layer 142.

Figure 5B:
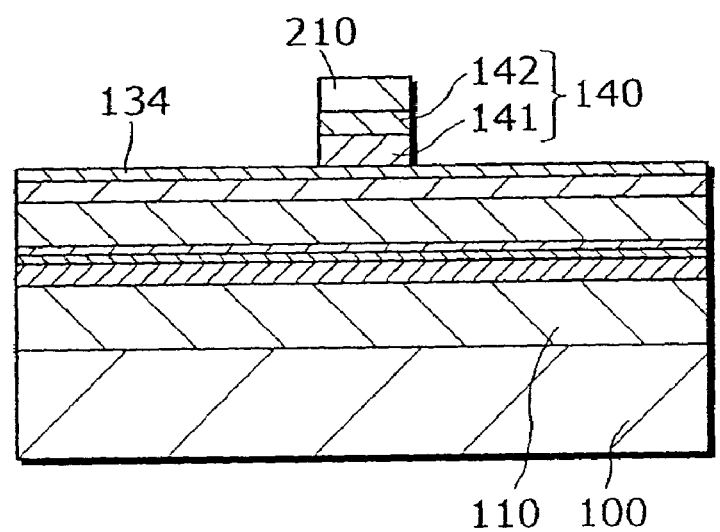

Next, as is shown in FIG. 5B, the island-shaped third step layer 140 is formed by forming a pattern to form the third step layer 140 using a photoresist 210, and then etching the emitter contact layer 142 and the emitter cap layer 141 using mixed solution of phosphoric acid, hydrogen peroxide and water. At this time, etching is rarely performed to the emitter layer 134.

Figure 5C:
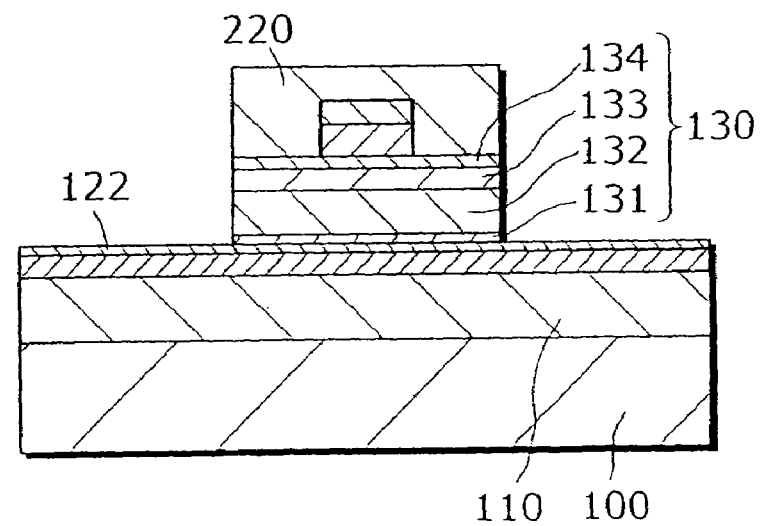

Next, as is shown in FIG. 5C, the island-shaped second step layer 130 is formed by forming a pattern to form the second step layer 130 using a photoresist 220, etching the emitter layer 134 selectively using hydrochloric acid diluted with water, and then etching the base layer 133, the second collector layer 132 and the second spacer layer 131 using mixed solution of phosphoric acid, hydrogen peroxide and water, with the emitter layer 134 being masked. At this time, since the first space layer 122, which is made of InGaP, functions as a stopper layer for etching with mixed solution of phosphoric acid, hydrogen peroxide and water, it is possible to perform etching to form the second step layer 130 with extremely high processability.

Figure 6A:
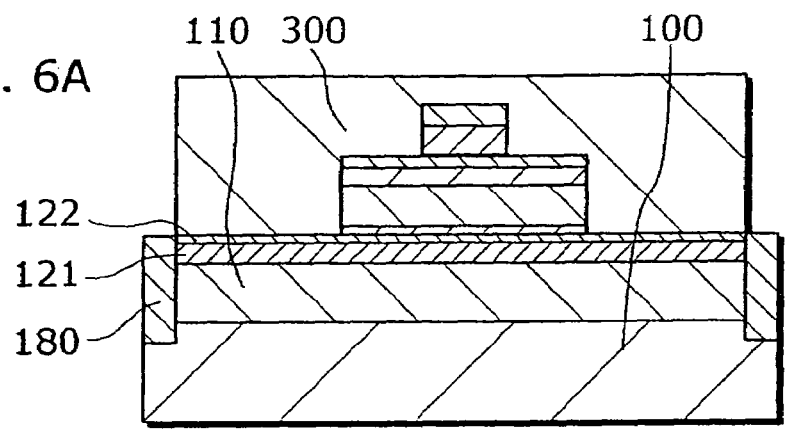
FIG. 6A–FIG. 6C are cross-sectional diagrams showing the manufacturing method of the HBT according to the present embodiment.

Next, as is shown in FIG. 6A, the element isolation region 180 is formed by forming a pattern to form the element isolation region 180 using a photoresist 300, and then performing He ion implantation to the first spacer layer 122, the sub-collector layer 110 and the first collector layer 121, under the implantation condition of an acceleration voltage of 200 keV and a dose amount of $8\times10^{13}$ cm$^{-2}$.

Figure 6B:
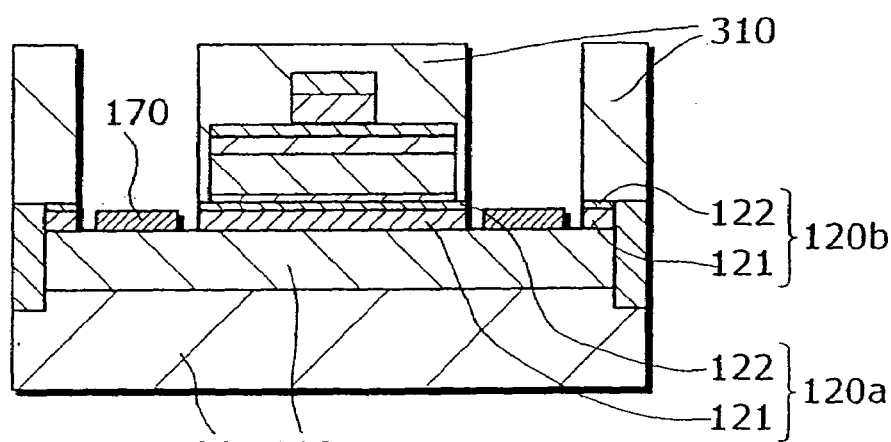

Next, as is shown in FIG. 6B, the first step layer 120a and 120b is formed by forming a pattern to form the collector electrodes 170 and the first step layer 120a and 120b using a photoresist 310, and then etching the first spacer layer 122 and the first collector layer 121 selectively with hydrochloric acid diluted with water. And then, the collector electrodes 170 made of AuGe/Ni/Au are formed by evaporating a metal in exposed areas on the sub-collector layer 110 and lifting off the metal. At this time, since a sub-collector layer 110, which is made of GaAs, functions as a stopper layer for etching with hydrochloric acid diluted with water, it is possible to perform etching to form the first step layer 120a and 120b as well as the collector electrodes 170 with extremely high processability.

Figure 6C:
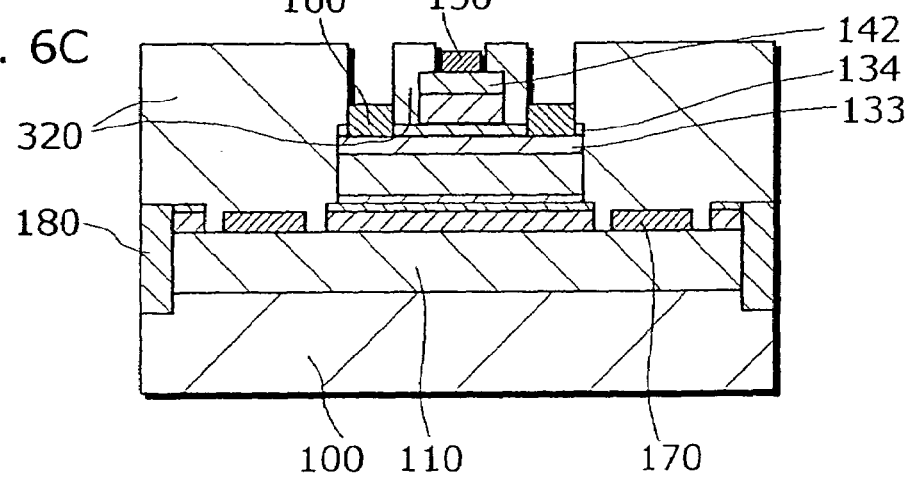

Next, as is shown in FIG. 6C, the emitter electrode 150 and the base electrodes 160 made of Pt/Ti/Pt/Au are formed at the same time by forming a pattern to form the emitter electrode 150 and the base electrodes 160 using a photoresist 320, and then evaporating a metal on the emitter layer 134 and the emitter contact layer 142 and lifting off the metal. Then, by applying heat treating, the emitter electrode 150, the base electrodes 160 and the collector electrodes 170 are alloyed; the element isolation regions 180 are inactivated; and further the base electrodes 160 are brought into ohmic contact with the base layer 133.

As is stated above, using the HBT of the present embodiment, the followings are formed on the sub-collector layer 110: the first collector layer 121 made of $In_xGa_{1-x}P$ ($0.47 \leq x \leq 0.52$) with a smaller avalanche coefficient than that of GaAs that is a semiconductor material of the sub-collector layer 110; and the n-type second collector layer 132 with lower dopant concentration than dopant concentration of the sub-collector layer 110. Therefore, since a semiconductor layer, made of a semiconductor material with a small avalanche coefficient, is inserted into the collector-sub-collector interface to which the electric field is concentrated when the electric current is high, it is possible to restrain an avalanche breakdown at the collector-sub-collector interface. As a result, the HBT of the present embodiment can realize an HBT that satisfies high resistance required to avoid a potential breakdown of the HBT with high output. For example, since the HBT is not broken down at VSWR=10:1, it is possible to realize an HBT that can be commercially utilized as a power device of a terminal transmitter of the GSM-system.

Additionally, in the HBT of the present embodiment, the first spacer layer 122 and the second spacer layer 131 for alleviating the discontinuity of the conduction band exist between the first collector layer 121 and the second collector layer 132. Therefore, it is possible to decrease the collector resistance and to restrain the on resistance, and thus the HBT of the present embodiment can realize a highly efficient HBT.

By the way, in the HBT of the present embodiment, it is assumed that the dopant concentration of the first collector layer 121 is fixed at $1\times10^{17}$ cm$^{-3}$. However, the dopant concentration of the first collector layer 121 is $5\times10^{18}$ cm$^{-3}$ at the interface with the sub-collector, and $1\times10^{17}$ cm$^{-3}$ at the interface with the second collector layer. Therefore, the dopant concentration may become lower from the interface with the sub-collector layer to the interface with the second collector layer gradually or successively. Accordingly, it is possible to alleviate the discontinuity of the conduction band between the first collector layer and the sub-collector layer and the discontinuity of the conduction band between the first collector layer and the second collector layer and to restrain the on resistance. Therefore, it is possible to realize a highly efficient HBT.

Additionally, in the HBT of the present embodiment, the first spacer layer 122, made of InGaP, functions as a stopper layer for etching with phosphoric acid-hydrogen peroxide-system etchant when the second step layer 130 is formed. However, the first spacer layer may be made of AlGaAs and function as a stopper layer for etching with citric acid-hydrogen peroxide-system etchant. Accordingly, it is possible to improve substantially the accuracy of etching, as is the case with the etching using the first spacer layer made of InGaP.

Additionally, in the HBT of the present embodiment, the second collector layer 132 is made of GaAs to which an n-type dopant is doped. However, the second collector layer may be made of a non-doped i-type GaAs.

Additionally, in the HBT of the present embodiment, the first spacer layer 122 and the second spacer layer 131 exist between the first collector layer 121 and the second collector layer 132. However, between the first collector layer and the second collector layer, neither the first spacer layer nor the second spacer layer need to exist, or either one of them may exist.

Additionally, in the HBT of the present embodiment, the first collector layer 121 is made of $In_xGa_{1-x}P$ ($0.47 \leq x \leq 0.52$) with a smaller avalanche coefficient than that of GaAs that is the semiconductor material of the sub-collector 110. However, the first collector layer is not necessarily made of $In_xGa_{1-x}P$, and may be made of any other semiconductor material with a smaller avalanche coefficient than that of GaAs. For example, the first collector layer may be made of another semiconductor material such as AlGaAs or GaP.

Additionally, the first collector layer 121 may have a disordered structure. Therefore, it is possible to decrease the collector resistance and to restrain the on resistance, and thus the HBT of the present embodiment can realize a highly efficient HBT.

Additionally, in the HBT in the present embodiment, the first collector layer 121 is made of $In_xGa_{1-x}P$ ($0.47 \leq x \leq 0.52$) and the emitter layer 134 is also made of $In_xGa_{1-x}P$ ($0.47 \leq x \leq 0.52$). However, the first collector layer may be made of $Al_yGa_{1-y}As$ ($0 \leq y \leq 1$) and the emitter layer may also be made of $Al_yGa_{1-y}As$ ($0 \leq y \leq 1$).

Additionally, in the HBT of the present embodiment, the first collector layer 121 is made of $In_xGa_{1-x}P$ ($0.47 \leq x \leq 0.52$). However, the first collector layer 121 may be made of $Al_yGa_{1-y}As$ ($0 \leq y \leq 1$) and the composition ratio y of Al may be decreased gradually from the interface with the sub-collector layer toward the interface with the second collector layer. Accordingly, it is possible to realize a highly efficient HBT because the discontinuity of the conduction band between the first collector layer and the sub-collector layer and the discontinuity of the conduction band between the first collector layer and the second collector layer can be alleviated and the on resistance can be restrained.

INDUSTRIAL APPLICABILITY

The present invention can be utilized for a hetero-junction bipolar transistor, and especially can be utilized for a high-frequency analogue element and the like used for a cell phone and the like.

What is claimed is:

1. A manufacturing method of a hetero-junction bipolar transistor, comprising:
    a first step of laminating a sub-collector layer, a first collector layer, a first spacer layer, a second spacer layer, a second collector layer, a base layer and an emitter layer on a semiconductor substrate in this sequence;
    a second step of etching a predetermined region in the emitter layer with a first etchant;
    a third step of etching the base layer, the second collector layer and the second spacer layer with a second etchant using the etched emitter layer as a mask; and
    a fourth step of etching, with a third etchant, predetermined regions in the first spacer layer and the first collector layer exposed by the etching with the second etchant.

2. The manufacturing method of the hetero-junction bipolar transistor according to claim 1,
    wherein each of the sub-collector layer, the base layer, the second collector layer and the second spacer layer is made of GaAs to which a dopant is doped, and each of the first collector layer and the first spacer layer is made of InGaP to which a dopant is doped,
    the second etchant in the third step is a mixed solution of phosphoric acid, hydrogen peroxide and water, and
    the third etchant in the fourth step is hydrochloric acid diluted with water.

3. The manufacturing method of the hetero-junction bipolar transistor according to claim 1,
    wherein the hetero-junction bipolar transistor further includes an emitter cap layer, an emitter contact layer, an emitter electrode, a collector electrode and a base electrode,
    the first step includes:
    a first sub-step of laminating the emitter cap layer and the emitter contact layer on the emitter layer in this sequence; and
    a second sub-step of etching predetermined regions in the emitter cap layer and the emitter contact layer with a fourth etchant, and
    the manufacturing method of the hetero-junction bipolar transistor further comprises:
    a fifth step of forming the collector electrode on the sub-collector layer exposed by the etching with the third etchant; and
    a sixth step of forming the emitter electrode on the emitter layer exposed by the etching with the fourth etchant, and forming the base electrode on the emitter contact layer exposed by the etching with the fourth etchant.

4. The manufacturing method of the hetero-junction bipolar transistor according to claim 3,
    wherein the hetero-junction bipolar transistor has a stepped surface, a third step layer that constitutes the stepped surface is formed by etching the predetermined regions in the emitter cap layer and the emitter contact layer in the second sub-step, a second step layer that constitutes the stepped surface is formed by etching the emitter layer that exists outside an outer edge of the third step layer in the second step and by etching the base layer, the second collector layer and the second spacer layer using said etched emitter layer as the mask in the third step, and a first step layer that constitutes the stepped surface is formed by etching the first spacer layer and the first collector layer that exist outside an outer edge of the second step layer in the fourth step.

* * * * *